United States Patent
Ladner et al.

(10) Patent No.: US 10,991,416 B1
(45) Date of Patent: Apr. 27, 2021

(54) CAPACITANCE-BASED COMPENSATION CIRCUITRY

(71) Applicant: Micron Technology, Inc., Boise, ID (US)

(72) Inventors: Brian J. Ladner, Fairview, TX (US); Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/803,486

(22) Filed: Feb. 27, 2020

(51) Int. Cl.
| G06F 13/28 | (2006.01) |
| G11C 11/4076 | (2006.01) |
| G11C 11/4096 | (2006.01) |
| G11C 11/4093 | (2006.01) |
| H03K 19/20 | (2006.01) |

(52) U.S. Cl.
CPC ...... *G11C 11/4076* (2013.01); *G11C 11/4093* (2013.01); *G11C 11/4096* (2013.01); *H03K 19/20* (2013.01)

(58) Field of Classification Search
CPC ............ G11C 11/4076; G11C 11/4093; G11C 11/4096; H03K 19/20
USPC .......................................................... 711/105
See application file for complete search history.

(56) References Cited

U.S. PATENT DOCUMENTS

| 2002/0161968 | A1* | 10/2002 | Yoo | ......................... G11C 7/10 711/105 |
| 2009/0248971 | A1* | 10/2009 | Horowitz | .............. G06F 3/0661 711/105 |
| 2014/0269120 | A1* | 9/2014 | Na | ........................ H03L 7/0814 365/193 |

* cited by examiner

*Primary Examiner* — Huan Hoang
(74) *Attorney, Agent, or Firm* — Fletcher Yoder, P.C.

(57) ABSTRACT

Systems and methods may involve circuitry that receives a first transition of a clocking signal. The circuitry may also to enable a compensation circuit characterized by a capacitance in response to the first transition of the clocking signal and may receive subsequent transitions of the clocking signal. The circuitry may also apply the capacitance to the subsequent transitions of the clocking signal after enabling the compensation circuit to generate a compensated clocking signal characterized by an adjusted duty cycle relative to a duty cycle of the clocking signal.

20 Claims, 5 Drawing Sheets

CAPACITANCE-BASED COMPENSATION CIRCUITRY

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include firmware, or instructions executable by the processing circuitry to perform an operation and/or may include data to be used as an input for the operation. In addition, in some cases, data output from the operation may be stored in memory, such as to enable subsequent retrieval of the data from the memory.

Operational rates of memory devices, including the data rate of a memory device, have been increased over time. As speeds of memory devices increase, a likelihood for data errors occurring may increase since a duration of time to clock data signals is reduced. Furthermore, inter-symbol interference (ISI) may additionally or alternatively introduce challenges into memory device operation. ISI may be a component of noise affecting a data clock signal (DQS signal) of the memory device, and thus may change a transmission pattern of the DQS signal. For example, ISI may adjust a duration of a first transition of the DQS signal between logic high and logic low, such that a duration of the first transition may vary from durations of subsequent transitions. This variance may correct itself some over many clocking cycles. However, even one clocking cycle misclocking data to or from the memory device may cause a data error. Thus, more efficient ways to compensate for ISI altering the DQS signal may be desired.

BRIEF DESCRIPTION OF THE DRAWINGS

Various aspects of this disclosure may better be understood upon reading the following detailed description and upon reference to the drawings in which.

DETAILED DESCRIPTION

Figure 1:
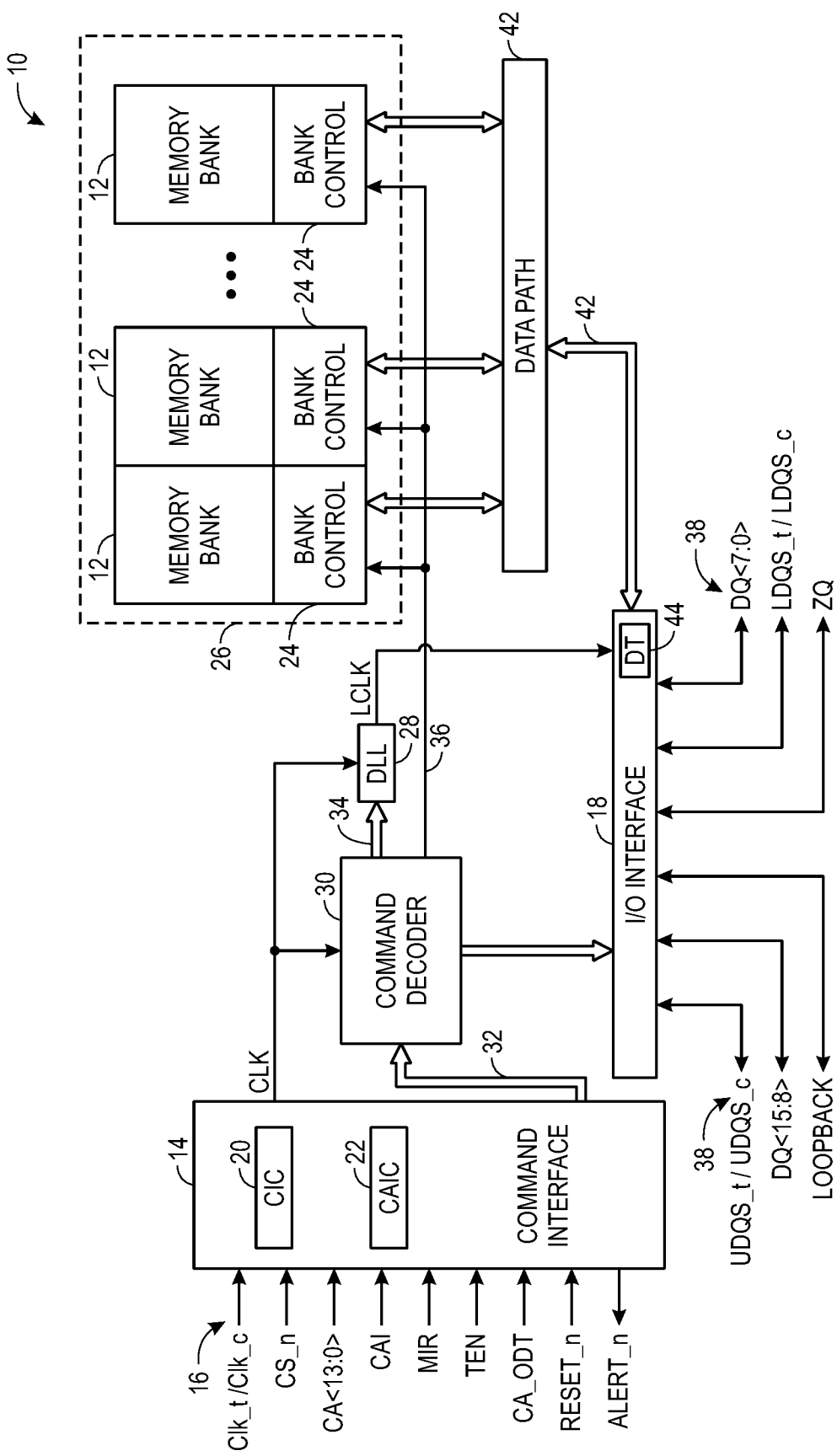
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Embodiments of the present disclosure relate generally to the field of semiconductor memory devices. More specifically, embodiments of the present disclosure relate to using a capacitance-based compensation circuit (e.g., circuitry) of a semiconductor memory device to correct distortions in transmitted clock signals (DQS signals). For example, inter-symbol interference (ISI) may additionally or alternatively introduce distortions into the DQS signals of a memory device. One manner to correct for distortions in the DQS signals, such as ISI-based distortions, is to use a compensation circuit. The compensation circuit may compensate (e.g., undo, mitigate, or offset) the effect of the ISI and/or other distortions on the DQS signals (e.g., clocking signals).

Using a compensation circuit of a memory device to perform distortion correction, such as to compensate for distortions in a received data clocking signal (DOS signal) of the memory device, may be valuable. For example, there may be a duration of time that the memory device is not receiving a DQS signal (e.g., steady state or disabled state), and thus is in an idle period. At exit from the idle period (e.g., operational switch from a steady state to a transitioning state), the memory device may receive the DOS signal. At the change from idle to switching, distortions may be introduced to the first transition of the DOS signal that remain unresolved during a respective data transmission due at least in part to the data transmission occurring too quickly to correct inconsistencies using traditional methods. Distortions introduced to the first transition of the DOS signal may propagate to subsequent transitions. This may increase a likelihood that a data error occurs, such as the memory device clocking a data signal at an incorrect time. For example, errors introduced into the timing of the DOS signal, such as by changing timing of the transitions of the DQS signal, may cause the DOS signal to incorrectly clock a data signal of the memory device. In this way, a distorted DQS signal may clock a data signal too early or too late, causing inaccurate or invalid data to be clocked and/or used in memory device operations.

To correct for the distortions, the memory device may use a first transition of the DQS signal to enable the compensation circuit. Once enabled, the compensation circuit may use capacitances to slow down subsequent transitions of the DOS signal to match the slower, first transition of the DQS signal. By adjusting the subsequent transitions of the DQS signal to match the first transition, a duty cycle of the DQS signal may improve. It is generally desired that the DOS signal is consistent such that the duty cycle equals 50% (e.g., 50/50 (high/low)) of the total duration of a respective clock cycle. The systems and methods discussed herein have been simulated to shown an improvement in duty cycle from around 47% to 49.5%, an improvement toward the desired 50% duty cycle.

Other methods of compensating for the distortion may include extending the first transition of the DQS signal to match the subsequent transitions and/or to match a desired transition. However, the other methods may use advance knowledge of an arrival time of the DQS signal and/or advance knowledge of the subsequent transitions (e.g., such as a duration of time to be used for a high period of the clocking signal and a low period of the clocking cycle) when determining at what time to activate control signals and/or circuitry to extend the first transition. Indeed, when any predictions for the arrival time of the first transition are incorrect, relatively large amounts of power may be spent waiting for the arrival of the first transition (since the first transition may be unable to be compensated for in these other methods if the arrival is missed). For example, techniques may be used to bring an input to a memory device to a mid-point state and/or may be used to boost the input such that the first transition of the DQS signal is adjusted as opposed to subsequent transitions. These techniques, however, may disadvantageously use relatively higher amounts of power to preemptively power driving circuitry to change the input of the memory device than, as described herein, an amount of power used to reduce a transition duration of subsequent transitions of the DQS signal after a first transition of the DOS signal.

Using a compensation circuit to compensate for the distortion after a first transition of the DQS signal may be an improvement to the other methods of compensating for the distortion since enabling the compensation circuitry may occur after receiving the DOS signal. For example, enabling the compensation circuitry after receiving the DOS signal may reduce or eliminate a likelihood of wasting current and/or power by powering compensation circuitry before the DQS signal is received, and thereby improve operation of the memory device (e.g., by reducing power consumed by the memory device when correcting for distortion in the DQS signal).

In some cases, multiple compensated DQS signals may be generated. For example, the memory device may use a DQS signal to clock data (DQ) signals on multiple paths. To generate multiple compensated DQS signals, multiple capacitance-based compensation circuitries may operate in parallel. Each of the capacitance-based compensation circuitries may receive an enable signal at a substantially similar time in response to the first transition of the DQS signal, and may operate to truncate the subsequent transitions based on the first transition. Each output compensated DQS signal may be used to respective clock the multiple paths transmitting the DQ signals.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 that receives signals 16 from an external device (not shown), such as a processor or controller, and provides the signals 16 to other portions of the memory device 10. The memory device 10 may also include an input/output (I/O) interface 18 configured to exchange (e.g., receive and transmit) signals with external devices. The external device (e.g., a processor or controller) may provide various signals 16 to the memory device 10, via the command interface 14, to facilitate the transmission and receipt of data to be written to or read from the memory device 10.

As will be appreciated, the command interface 14 may include a number of circuits, such as a clock input circuit 20 and a command address input circuit 22, for instance, to ensure proper handling of the signals 16. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, refresh commands) are typically entered on the positive edges of the clock signal and data is transmitted or received on both the positive and negative clock edges.

In some cases, each memory bank 12 includes a bank control block 24 which provides the necessary decoding (e.g., row decoder and column decoder), as well as other features, such as timing control and data control, to facilitate the execution of commands to and from the memory banks 12. Collectively, the memory banks 12 and/or the bank control blocks 24 may be referred to as a memory array 26.

The clock input circuit 20 receives the true clock signal (Clk_t/) and the complementary clock signal (Clk_c) and generates an internal clock signal CLK. The internal clock signal CLK is supplied to an internal clock generator 28, such as a delay locked loop (DLL) circuit. The internal clock generator 28 generates a phase controlled internal clock signal LCLK based on the received internal clock signal CLK. The phase controlled internal clock signal LCLK is supplied to the I/O interface 18, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 30.

The command decoder 30 may receive command signals from a command bus 32 and may decode the command signals to provide various internal commands. For instance, the command decoder 30 may provide command signals to the internal clock generator 28 over a bus 34 to coordinate generation of the phase controlled internal clock signal LCLK. The phase controlled internal clock signal LCLK may be used to clock data through the I/O interface 18, for instance.

Further, the command decoder 30 may decode commands, such as read commands, write commands, mode-register set commands, activate commands, or the like, and provide access to a particular memory bank 12 corresponding to the command, via bus 36. As will be appreciated, the memory device 10 may include various other decoders, such as row decoders and column decoders, to facilitate access to the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_c). The command interface 14 may include a command address input circuit 22 that receives and transmits the commands to provide access to the memory banks 12, such as through the command decoder 30. In addition, the command interface 14 may receive a chip select signal (CS_n). The CS_n signal enables the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 38 through the I/O interface 18. More specifically, the data may be sent to or retrieved from the memory banks 12 over data bus 42, which may include one or more bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a ×16 memory device, the I/O signals may be divided into upper and lower I/O signals (e.g., DQ<15:8> and DQ<7:0>) corresponding to upper and lower bytes of the data signals, for instance.

To transmit data using higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). The DQS signals may transition and/or alternate in value between a logic low (e.g., "0") threshold amount (e.g., current value, voltage value) and a logic high (e.g., "1") threshold amount, such that data output (DQ) signals are read, written, and/or generally transmitted on a rising edge and/or falling edge of the DQS signals. The logic low threshold amount may be approximately equal to a system low voltage provided on a low voltage bus, such as a ground bus, while the logic high threshold amount may be approximately equal to a system high voltage provided on a high voltage bus (e.g., VCC). Approximately equal in value may correspond to a voltages that differ in value by a threshold amount, such as 1 volt [V], 2V, 3V, and so on, or at any larger or smaller granularity, such as 1 millivolts [mV], 0.5 mV, and so on.

For read commands, the DQS signals are effectively additional DQ signals with a predetermined pattern. For write commands, the DQS signals are used as clock signals to capture the corresponding input data. As with the clock signals (Clk_t/and Clk_c), the data strobe (DQS) signals may be provided as a differential pair of data strobe signals (DQS_t/and DQS_c) to provide differential pair signaling during reads and writes. For certain memory devices, such as a DDR5 SDRAM memory device, the differential pairs of DQS signals may be divided into upper and lower data strobe signals (e.g., UDQS_t/and UDQS c; LDQS_t/and LDQS_c) corresponding to upper and lower bytes of data sent to and from the memory device 10, for instance.

An impedance (ZQ) calibration signal may also be provided to the memory device 10 through the I/O interface 18. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/ VSS external to the memory device 10. This resistor acts as a reference for adjusting internal ODT and drive strength of the IO pins.

In addition, a loopback signal (LOOPBACK) may be provided to the memory device 10 through the I/O interface 18. The loopback signal may be used during a test or debugging phase to set the memory device 10 into a mode wherein signals are looped back through the memory device 10 through the same pin. For instance, the loopback signal may be used to set the memory device 10 to test the data output of the memory device 10. Loopback may include both a data and a strobe or possibly just a data pin. This is generally intended to be used to monitor the data captured by the memory device 10 at the I/O interface 18.

As may be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), or the like, may also be incorporated into the memory system 10. Accordingly, it should be understood that the block diagram of FIG. 1 is only provided to highlight certain functional features of the memory device 10 to aid in the subsequent detailed description.

In some embodiments, the memory device 10 may be disposed in (e.g., physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

As discussed above, data may be written to and read from the memory device 10, for example, by the host whereby the memory device 10 operates as volatile memory, such as Double Data Rate DRAM (e.g., DDR5 SDRAM). The host may, in some embodiments, also include separate non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) as well as other types of memory devices (e.g., storage), such as solid state drives (SSD's), MultimediaMediaCards (MMC's), SecureDigital (SD) cards, CompactFlash (CF) cards, or any other suitable device. Further, it should be appreciated that the host may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices enable a user to input data into the host, for example, buttons, switching elements, a keyboard, a light pen, a stylus, a mouse, and/or a voice recognition system, for instance. The host may optionally also include an output device, such as a display coupled to the processor and a network interface device, such as a Network Interface Card (NIC), for interfacing with a network, such as the Internet. As will be appreciated, the host may include many other components, depending on the application of the host.

The host may operate to transfer data to the memory device 10 for storage and may read data from the memory device 10 to perform various operations at the host. Accordingly, to facilitate these data transmissions, in some embodiments, the I/O interface 18 may include a data transceiver 44 that operates to receive and transmit DQ signals to and from the I/O interface 18.

Figure 2:
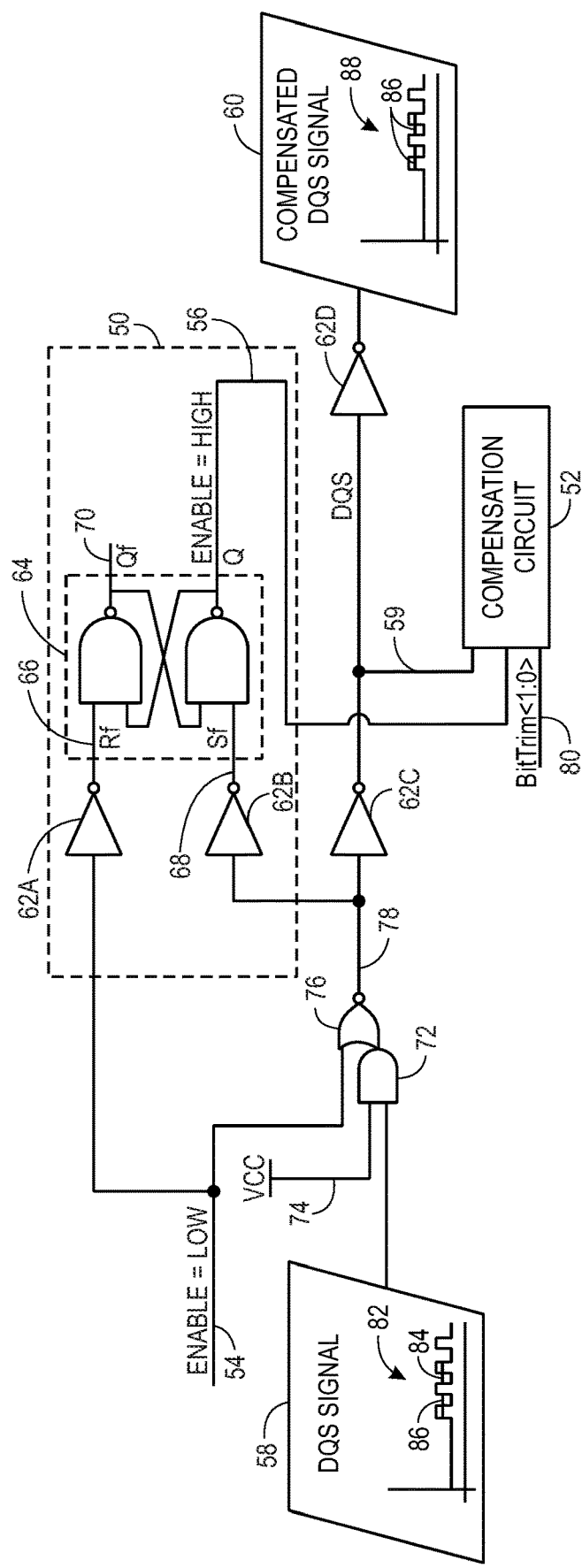
FIG. 2 is a circuit diagram of compensation circuitry and enable circuitry of the I/O interface of FIG. 1, according to an embodiment of the present disclosure.

FIG. 2 illustrates an enable circuit 50 and a compensation circuit 52 that may be included in the I/O interface 18 of the memory device 10 and/or at another suitable location within the memory device 10. The I/O interface 18 may, at some time, receive an enable signal via path 54. A controller of the memory device 10 may turn off the enable circuit 50 by transmitting a logic high signal via the path 54.

When activated, the enable circuit 50 may supply an enable signal via a path 56 to the compensation circuit 52 when suitable conditions are met. It is noted that paths 54 and 56, in addition to the other pathways and/or paths described herein, may be formed from any suitable conductive material, such as a metal traces and/or bonded wire path. The compensation circuit 52 may activate in response to the enable signal via the path 56, where the enable signal via the path 56 may be activated (e.g., enabled, transmitted, change state) by the memory device 10 when receiving data sent by a processor writing the data to the memory device 10. It is noted that the compensation circuit 52 may not be active (e.g., not activated) in cases where data is being read from the memory device 10. When activated, the compensation circuit 52 may add capacitance to a data strobe signal (DQS signal) 58, such as a DQS signal received from external processor or controller sending the data (e.g., for a write command) and used to facilitate the memory device 10 in reading data signals (DQ signals) to be written into the memory banks. In this way, a controller of the memory device 10 may turn on the enable circuit 50 in anticipation of receiving the DQS signal 58, where the enable circuit 50 transmits the enable signal via the path 56 to the compensation circuit 52 in response to receiving a first transition of the DQS signal 58.

For example, the enable signal via the path 54 may be generated in response to receiving a write memory command indicating that a clocking signal (e.g., DQS signal 58) is about to be transmitted to the memory device 10 for use in reading one or more DQ signals to be written into the memory banks 12. The enable signal via the path 54 may be characterized by a logic low voltage level (e.g., ENABLE=LOW state) for a duration of a write memory command and/or for a duration of time that the clocking signal is used to read in the one or more DQ signals for writing into the memory banks 12. At conclusion of the write operation, the enable signal via the path 54 may be deactivated (e.g., ENABLE=HIGH) and be characterized by a logic high voltage level. In this way, an external processor may generate the first transition of the DQS signal 58 in response to a generation of a write memory command (e.g., in response to the external processor generating the write memory command and transmitting the write memory command to the memory device 10). After adjustment by the compensation circuit 52 on path 59, the DQS signal 58 may output from the I/O interface 18 as a compensated DQS signal 60. The compensated DQS signal 60 may be used to suitably write data signals to the memory device 10 in an improved manner relative to using the DQS signal 58.

Inverters 62 (62A, 62B, 62C, 62D) may be included to change an amplitude of a signal on its corresponding path from logic high to logic low (or from logic low to logic high) and/or to introduce additional signal delay such that timing is as desired of the DQS signal. For example, the inverters 62 may add additional delay or change the amplitude of signals as a way to make control schema work suitably with components included in the I/O circuit 18.

A latching circuit 64 may be included to hold an output until the DQS signal 58 stops. As depicted, the latching circuit 64 may be a set-reset latch (SR latch), and thus may behave according to Table 1. It is noted that any suitable logic gate combination and/or logic circuitry may be used in addition to or alternate of the SR latch, and in some cases may be combined with other supporting and/or facilitating logic gates, such as any combination of SR latches, flip-flops, gated latches, not-AND (NAND) gates, not-OR (NOR) gates, OR gates, AND gates, exclusive-OR (XOR) gates, inverters, or the like.

TABLE 1

| S | R | Q | Qf |
|---|---|---|---|
| 0 | 0 | 1 | 1 |
| 0 | 1 | 1 | 0 |
| 1 | 0 | 0 | 1 |
| 1 | 1 | memory | memory |

Keeping the foregoing in mind, the state of the latching circuit 64 may be calculated when a signal on a path 66 is logic low, such as when the enable signal on the path 54 is logic high. In this state, the latching circuit 64 may receive a logic low signal on the path 66 (e.g., R=0) and a logic high signal on the path 68 (e.g., S=1) before a time of a first transition of the DQS signal 58. This combination may set the output on the path 56 from the latching circuit 64 as logic low (e.g., Q=0). A logic low signal is provided to the compensation circuit 52 via the path 56, and a path 70 corresponding to the inverse of the output Q (e.g., Qf) transmits a logic high signal (e.g., Qf=1).

When the enable signal via the path 54 goes low (e.g., is activated, is enabled), a logic high signal transmits on the path 66 and on the path 68 to the latching circuit 64 (e.g., R=1, S=1). The latching circuit 64 may continue to output the previously set logic low value (e.g., memorized value Q=0) on the path 56.

When the DQS signal 58 is received and while the enable signal via the path 54 is held low, the input to the latching circuit 64 may change to S=1. This may be the result of a first clocking transition of the DQS signal 58 being provided to logic gate 72 (e.g., AND gate) along with a logic high signal on path 74 (where path 74 is coupled to a system logic high voltage supply (e.g., VCC)). The output from the logic gate 72 is provided to logic gate 76 (e.g., NOR gate) along with a logic low signal on path 54. The logic gate 76 may output a logic high signal that is inverted, and thus transmitted as a logic low signal via path 78. The inverter 62B may receive the logic low signal via the path 78 and invert the logic low signal to generate a logic high signal via the path 68 (e.g., S=1). Since this describes a first transition of the DQS signal 58, the latching circuit 64 may receive a combination of inputs equally S=1 and R=1 that prepares the latching circuit 64 to store an input value to its memory.

After a duration of time, the DQS signal 58 transmits as a logic low signal (e.g., since system clocks transition as square-waved signals between generally logic high voltage values and logic low voltage values) after being transmitted as the logic high signal. This causes the input received at the latching circuit 64 to change from S=1 to S=0 on the path 68. The latching circuit 64 is thus operated to store a logic high output, Q=1, thereby enabling the compensation circuit 52.

Subsequent transitions of the DQS signal 58 (e.g., S=1 to S=0 to S=1) may cause no change in output from the latching circuit 64, since the latching circuit 64 changes from outputting from "memory" to Q=1 and back to "memory" (according to Table 1). To end compensation, the I/O interface 18 may receive a logic high signal on the path 54. The path 54 transmitting a logic high signal may cause the path 66 to transmit a logic low signal R=0, which in turn causes the inverter 62B to supply a logic low signal via the path 68 (e.g., S=0), causing the disabling of the compensation circuit 52 when the latching circuit 64 transmits Q=0.

Thus, as illustrated in inset graph 82, the compensation circuit 52 may adjust transition periods of the DQS signal 58 subsequent to a first transition period from a period 84 to a period 86. This is shown in inset graph 88, where the compensated DQS signal 60 has equal periods 86 since transition periods of the DQS signal 58 subsequent to the first transition period are reduced to match the first transition period (e.g. the period 86). As will be appreciated, the compensation circuit 52 may be programmable. In this way, programming control signals may be transmitted to the compensation circuit 52 via a path 80. Applying different combinations of the programming control signals may adjust an amount of adjustment applied to the DQS signal 58 before being transmitted as the compensated DQS signal 60.

Figure 3:
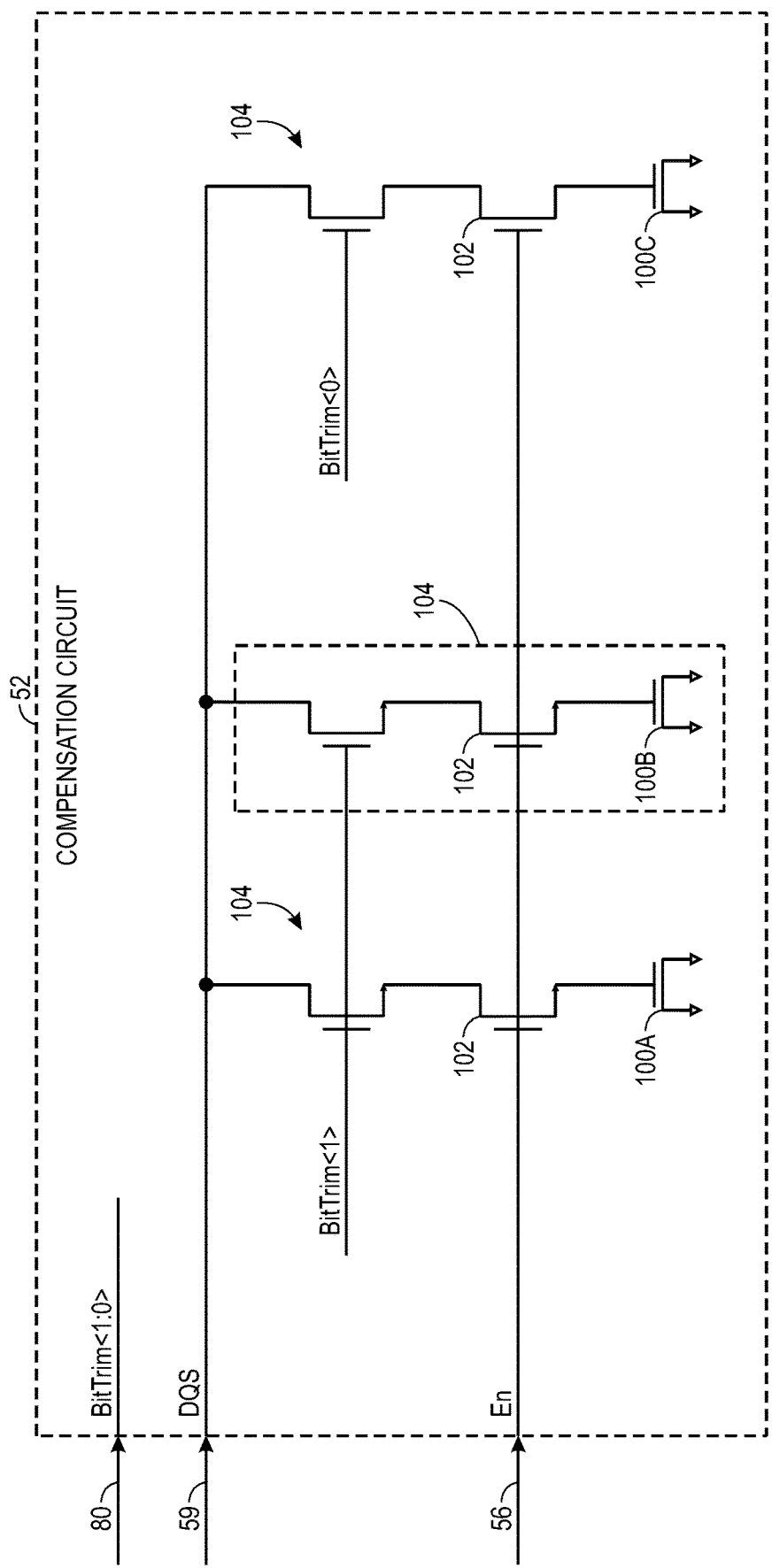
FIG. 3 is a circuit diagram of an embodiment of the compensation circuitry of FIG. 2, according to an embodiment of the present disclosure.

To elaborate, FIG. 3 is a circuit diagram of an example of the compensation circuit 52. As described above, the compensation circuit 52 may receive the DQS signal on the path 59, the enable signal on the path 56, and/or programming control signals (BitTrim<1:0>) on the path 80. The programming control signals may control which of the capacitors 100 (100A, 100B, 100C) adjust the transition periods of the DQS signal 58.

When the compensation circuit 52 is enabled, switches 102 may each be activated. These switches 102 may be activated or deactivated in response to a same clocking cycle affecting the output of the latching circuit 64. Each compensation path 104 may be activated or deactivated substantially simultaneous to each other. In this way, the compensation circuit 52 may use a programmable amount of capacitance to adjust the DQS signal 58. Each compensation path 104 and/or each of the capacitors 100 may be coupled in parallel with each other. It is noted that one or more of the capacitors 100 may be implemented as transistors (e.g., switches), such as transistors similar to those used as switches 102. This may be permitted since some transistors are characterized by a leakage capacitance between terminals of a transistor. For example, a transistor may operate as a capacitor using a gate capacitance when there is an active channel in the device, such as when the transistor is "on," enabled, or otherwise is transmitting current between the terminals of the transistor. Leveraging the parasitic capacitance of a transistor may provide a suitable amount of capacitance. The capacitors 100 may be of any suitable size. For example, the size of capacitor 110A and/or the size of capacitor 110B may be 10-times (10×) a width and 10× a length of a transistor used as one of the switches 102.

When the programming control signals transmit with a first state (e.g., BitTrim=00), a first amount of capacitance may be applied, such as no capacitance and/or an amount of capacitance characterizing the compensation paths 104 and/or circuitry of the compensation circuit 52. When the programming control signals transmit with a second state (e.g., BitTrim=01), a second amount of capacitance may be applied, such as an amount of capacitance corresponding to a capacitance value of the capacitor 100C. When the programming control signals transmit with a second state (e.g., BitTrim=10), a third amount of capacitance may be applied, such as an amount of capacitance corresponding to a capacitance value of the capacitors 100A and 100B. Furthermore, when the programming control signals transmit with a third state (e.g., BitTrim=11), a fourth amount of capacitance may be applied, such as an amount of capacitance corresponding to a capacitance value of the capacitors 100A, 100B, and 100C. In each case, an amount of capacitance characterizing the compensation paths 104 and/or circuitry of the compensation circuit 52 may adjust and/or add to an amount of capacitance compensating transition periods of the DQS signal 58.

For example, each compensation path 104 may add an additional 2 picoseconds (ps) of delay when activated and/or when added to the transmission path of the DQS signal 58. Thus, it may be said that a difference in time between subsequent durations of the compensated DQS signal 60 and the DQS signal 58 is a duration of time approximately equal to a value between 2 ps and 6 ps (e.g., 2 ps, 4 ps, 6 ps, substantially equal to a time value between 2 ps and 6 ps) and/or a time a threshold amount of time from 2 ps or 6 ps, such as a threshold equal 1 ps, 0.5 ps, or the like. When capacitance is added to the transmission path of the DQS signal 58, clocking transition periods may be reduced. For example, a duration of time that the DQS signal 58 is at a logic low level or a logic high level may reduce. In this way, an amount of capacitance applied to the DQS signal 58 by using the capacitors 100A, 100B, and 100C may be a greater amount of capacitance relative to just using the capacitor 100A.

The compensation circuit 52 may be used as part of a control loop that determines, during operation, which amount of capacitance is suitable for adjusting a DQS signal 58. For example, the compensation circuit 52 may be used as part of a startup and/or calibration operation at power-on of the memory device 10, such that when the memory device 10 powers-on, the compensation circuit 52 is calibrated to adjust a test DQS signal 58 to have a more equal duty cycle (e.g., consistent clock signal, 50% duty cycle). In some cases, the compensation circuit 52 may be calibrated during a manufacturing process. In this way, when a suitable amount of capacitance is added using the capacitors 100 and the switches 102, the switch state associated with the suitable capacitance configuration may be locked. For example, the switches 102 may be fused switches, such that once the suitable capacitance configuration is determined during manufacturing, the switch state may be locked, such as by "blowing" or locking the fuse to hold the switch state, and thus locking whether or not the respective one of the capacitors 100 is adjusting a capacitance characterizing the compensation circuit 52. Thus, each capacitor 100 may be said to be "fuse-locked capacitors."

Figure 4:
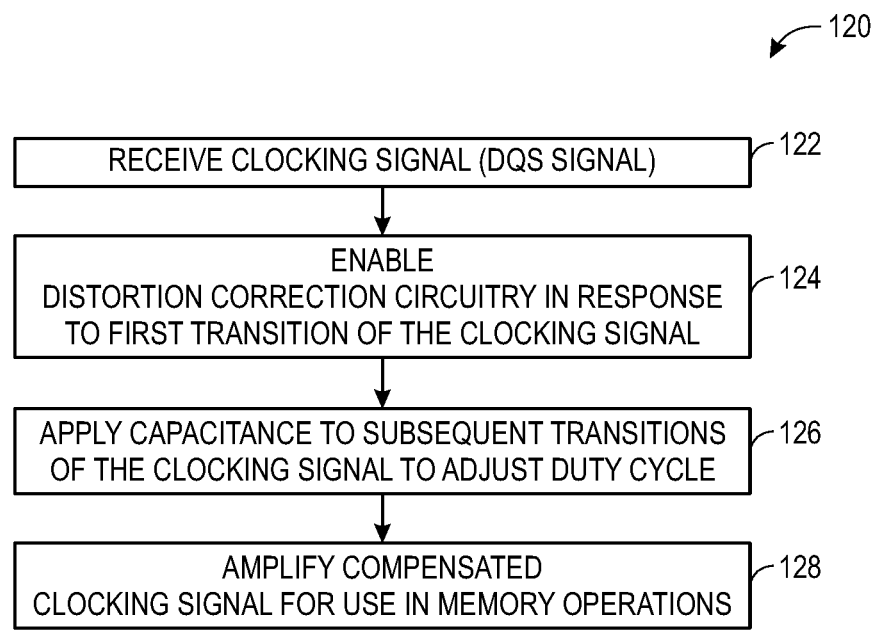
FIG. 4 is a flowchart of a process for operating the compensation circuitry and the enable circuitry of FIG. 2, according to an embodiment of the present disclosure.

To elaborate further on the operation of the compensation circuit 52, FIG. 4 illustrates a flowchart of a process 120 for operating the compensation circuit 52 and the enable circuit 50. Although the operations of process 120 are depicted in a particular order, it should be understood that some or each of the operations may be performed in a different order than the order depicted and/or in any suitable order.

At block 122, the DQS signal 58 may be received in the memory device 10, for example in the I/O interface 18. The DQS signal 58 may be a clocking signal that is generated by external circuitry of the memory device 10 and transmitted to the memory device 10 for use in clocking in data to the memory device 10. In some cases, the DQS signal 58 may be generated by the memory device 10 and transmitted to circuitry external from the memory device 10, such as to permit the circuitry external to use the DQS signal 58 to clock out data from the memory device 10. Sometimes, the DQS signal 58 is transmitted through an input buffer (e.g., input buffer 132 of FIG. 5) to amplify the DQS signal 58 to logic high levels and logic low levels used by the memory device 10 and/or by the external circuitry when interpreting a clocking state of the DQS signal 58.

At block 124, distortion correction circuitry (e.g., enable circuit 50 and compensation circuit 52) may be enabled. The enabling of the distortion correction circuitry may occur at least partially in response to transmission of an enable signal via the path 54. When the enable signal is transmitted via the path 54 and when the first transition of the DQS signal 58 is received at the enable circuit 50, the enable circuit 50 is activated and outputs an enable signal via the path 56 to the compensation circuit 52 while the enable signal continues to transmit via the path 54. It is noted that whether the enable signals are transmitted as logic high signals or logic low signals is based at least in part on the specific combination of logic gates, hardware, and/or software used to implement the methods discussed herein.

Once activated, at block 126, the compensation circuit 52 may apply capacitance to subsequent transitions after receiving the first clocking transition of the DQS signal 58. To do so, the DQS signal is transmitted via the path 59 and may be adjusted during the transmission of the DQS signal 58 between the inverter 62C and the inverter 62D. Thus, post-adjustment, the DQS signal 58 may be output as the compensated DQS signal 60. It is noted that a number of inverters 62 are depicted in the figures and described herein, however it should be understood that any number (e.g., 0, 1, 2, and so on) may be included in addition to or alternate of the inverters 62, such as to match a timing of signals of the memory device 10. In some cases, the compensated DQS signal 60 and/or the DQS signal 58 may be amplified.

For example, at block 128, the compensated DQS signal 60 may be amplified for use in memory operations. For example, the memory device 10 may include amplification circuitry, such as one or more output buffers. The amplification circuitry may be included before an output terminal coupled to the inverter 62D (e.g., downstream of the inverter 62D) and be used to adjust an amplitude of the compensated DQS signal 60 before use in a memory operation, such as in a memory read operation performed in response to a read memory command, a memory write operation performed in response to a write memory command, a memory refresh operation performed in response to a refresh memory command, or the like. Thus, the compensated DQS signal 60 may be increased in amplitude and/or adjusted in value prior to use in clocking out data to or from the memory device 10.

Figure 5:
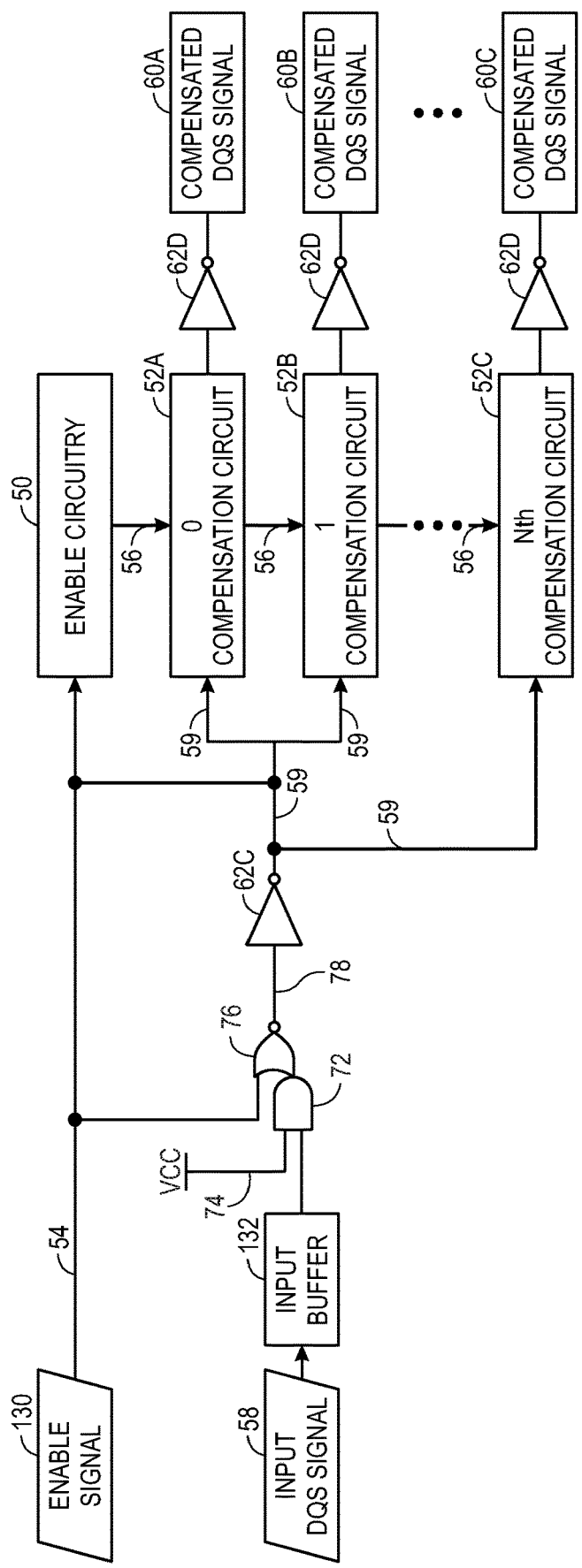
FIG. 5 is a block diagram of an embodiment of the compensation circuitry and the enable circuitry of FIG. 2 operated to generate multiple compensated clocking signals for use in reading multiple data bits, according to an embodiment of the present disclosure.

In some cases, the distortion correction circuitry (e.g., enable circuit 50 and compensation circuit 52) may be used to generate multiple compensated DQS signals 60. FIG. 5 illustrates a block diagram of an embodiment of the compensation circuit 52 and the enable circuit 50 generating multiple compensated DQS signals 60 (60A, 60B, 60C). Multiple compensated DQS signals 60 may be used when reading in or out multiple data bits and/or data paths in parallel. For example, the memory device 10 may use multiple DQS signals to clock data (DQ) signals on multiple paths. To generate multiple compensated DQS signals 60, multiple capacitance-based compensation circuitries 52 (52A, 52B, 52C) may generally operate in parallel. However, it should be noted that the adjustment of the multiple compensated DQS signals 60 may not occur in parallel since inverters 62 and/or other delay circuitry may be used to cause a generally parallel output of the multiple compensated. DQS signals 60, such as to correct any transmission path timing differences between the respective ones of the compensation circuits 52.

To elaborate on operation of the multiple compensation circuits 52, each of the capacitance-based compensation circuitries may receive an enable signal, and may operate to truncate the subsequent transitions based on the first transition. The enable circuit 50 may provide the output enable signal via the path 56 to each of the compensation circuits 52A, 52B, and 52C. The enable circuit 50 may activate in response to receiving a combination of the first transition of the DQS signal 58 and an enable signal 130 via the path 54. In some cases, the path 56 may include delay circuitry such as to delay the output enable signal to cause each of the compensation circuits 52A, 52B, and 52C to activate at a substantially similar time (e.g., the same time). Each output compensated DQS signal 60A, 60B, and 60C may be used to respectively clock the multiple paths transmitting the DQ signals.

Sometimes, an input buffer 132 may amplify the DQS signal 58 before transmitting the DQS signal 58 for compensation. Amplifying the DQS signal 58 using the input buffer 132 may increase an amplitude of the signal to a level suitable for logic gate 72 and/or logic gate 76 to read as a logic low signal and/or logic high signal. For example, the input buffer 132 may amplify the DQS signal 58 to a full rail and/or to a voltage or current level corresponding to full rail amounts for the memory device 10.

Technical effects of the present disclosure include systems and methods that permit adjustment of a clocking signal (e.g., DQS signal) to compensate for inter-symbol interference (ISI) distortions, for example, affecting a duty cycle of the clocking signal. To improve the clocking signal, such as by making a duration of time that the clocking signal has an approximately logic high value equal (or more equal) to a duration of time that the clocking signal has an approximately logic low value (e.g., approximately a 50% duty cycle), a compensation circuit may reduce subsequent transitions of the clocking signal to become closer in duration to a first transition of the clocking signal. In some cases, the first transition of the clocking signal may facilitate enabling of the compensation circuit, further improving operation of a memory device implementing these systems since less power is consumed since while awaiting arrival of the first transition of the clocking signal. In some cases, multiple compensation circuitries may be used to generate multiple compensating clocking signals, which may be used to read out or in data transmitted in parallel. As described, capacitors may be used by the compensation circuit to slow transitions of the clocking signal after the first transition, however other suitable methods may be used to slow the subsequent transitions.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
   compensation circuitry characterized by a capacitance applied to a clocking signal to generate a compensated clocking signal; and
   first logic circuitry configured to:
   receive a first transition of the clocking signal from an external processor, wherein the clocking signal comprises the first transition and subsequent transitions between a logic low threshold voltage and a logic high threshold voltage; and
   output an enable signal to the compensation circuitry in response to receiving the first transition, wherein the compensation circuitry is configured to apply the capacitance in response to receiving the enable signal to the subsequent transitions of the clocking signal after the first transition of the clocking signal to generate the compensated clocking signal.

2. The device of claim 1, wherein the external processor is configured to generate the first transition of the clocking signal in response to a generation of a write memory command.

3. The device of claim 1, comprising second logic circuitry configured to receive the first transition of the clocking signal and an enable signal from the external processor, wherein the first logic circuitry receives the first transition of the clocking signal from the external processor via the second logic circuitry.

4. The device of claim 3, wherein the second logic circuitry comprises an AND gate coupled to a first input that receives the first transition of the clocking signal from the external processor and a second input that receives a logic high signal from a logic high voltage supply, and wherein the AND gate is configured to output a signal to the first logic circuitry in response to the first transition of the clocking signal and the enable signal from the external processor.

5. The device of claim 1, comprising a plurality of inverters configured to delay the clocking signal when generating the compensated clocking signal.

6. The device of claim 1, wherein the compensation circuitry is configured to receive a control signal that adjusts a value of the capacitance.

7. The device of claim 6, wherein the compensation circuitry comprises:

a first switch that activates in response to the control signal; and a second switch that activates in response to the enable signal from the first logic circuitry, wherein the first switch and the second switch are configured to couple a capacitor to a path transmitting the clocking signal when activated.

8. The device of claim 7, comprising additional compensation circuitry configured to:

receive the enable signal from the first logic circuitry; and generate a plurality of compensated clocking signals, wherein the plurality of compensated clocking signals are configured to be used by a memory controller during a write operation to clock in a plurality of data bits to be written to memory based at least in part by clocking transitions of the plurality of compensated clocking signals.

9. A method, comprising:

receiving a first transition of a clocking signal;

enabling a compensation circuit characterized by a capacitance in response to the first transition of the clocking signal;

receiving subsequent transitions of the clocking signal; and applying the capacitance to the subsequent transitions of the clocking signal after enabling the compensation circuit to generate a compensated clocking signal characterized by an adjusted duty cycle relative to a duty cycle of the clocking signal.

10. The method of claim 9, comprising generating an enable signal in response to the first transition of the clocking signal after receiving a logic high signal from a processor, wherein the enabling of the compensation circuit comprises receiving the logic high signal and the first transition of the clocking signal at a same time.

11. The method of claim 10, comprising receiving a control signal, at the compensation circuit, wherein the control signal adjusts a value of the capacitance at least in part by activating a switch to couple one or more capacitors to a transmission path of the clocking signal.

12. The method of claim 9, comprising delaying the clocking signal by a duration of time equal to a delay affecting data corresponding to the clocking signal.

13. The method of claim 9, comprising applying the capacitance to a plurality of additional subsequent transitions of additional clocking signals to generate a plurality of compensated clocking signals comprising the compensated clocking signal.

14. The method of claim 13, comprising clocking in a plurality of data bits to be written to a memory array based at least in part by clocking transitions established using the plurality of compensated clocking signals.

15. A device, comprising:

an input buffer configured to receive a clocking signal from control circuitry comprising a first transition of a first duration and a second transition of a second duration, wherein the input buffer is configured to increase an amplitude of the clocking signal;

an enable circuit configured to generate an enable signal in response to the first transition of the clocking signal; and a first compensation circuit configured to:

receive the enable signal from the enable circuit;

adjust the second transition of the clocking signal from the second duration to the first duration; and generate a first compensated clocking signal comprising the first transition of the first duration and the second transition of the first duration, wherein the first compensated clocking signal is configured to be used in a memory operation associated with storing data or reading the data from a memory.

16. The device of claim 15, comprising:

a second compensation circuit configured to:

receive the enable signal from the enable circuit at a same time that the first compensation circuit receives the enable signal from the enable circuit;

adjust the second transition of the clocking signal from the second duration to the first duration; and generate a second compensated clocking signal comprising the first transition of the first duration and the second transition of the first duration, wherein the first compensated clocking signal and the second compensated clocking signal are configured to be used in the memory operation associated with storing data or reading the data from the memory.

17. The device of claim 15, wherein the enable circuit comprises a logic gate configured to output the enable signal in response to the first transition of the clocking signal and a logic high signal from a voltage supply of the memory, and wherein the logic gate comprises an AND gate, an OR gate, a not-AND gate, a not-OR gate, an exclusive-OR gate, an inverting gate, or any combination thereof.

18. The device of claim 15, comprising a plurality of inverters configured to delay the clocking signal when generating the first compensated clocking signal.

19. The device of claim 18, wherein a difference in time between the first duration and the second duration equals between 2 picoseconds (ps) and bps.

20. The device of claim 15, wherein a processor disposed outside of the memory is configured to generate the enable signal in response to a generation of a write memory command, a read memory command, a refresh memory command, or any combination thereof.

* * * * *